US010431730B2

(12) United States Patent
Chiba et al.

(10) Patent No.: US 10,431,730 B2
(45) Date of Patent: Oct. 1, 2019

(54) DIELECTRIC ELASTOMER DRIVING MECHANISM

(71) Applicants: Seiki Chiba, Tokyo (JP); Mikio Waki, Sakura-shi, Tochigi (JP)

(72) Inventors: Seiki Chiba, Tokyo (JP); Mikio Waki, Sakura (JP); Yoshinori Tanaka, Kyoto (JP); Kuniyoshi Okamoto, Kyoto (JP); Kazuya Nagase, Kyoto (JP); Naoaki Tsurumi, Kyoto (JP)

(73) Assignees: Seiki Chiba, Tokyo (JP); Mikio Waki, Tochigi (JP)

( * ) Notice: Subject to any disclaimer, the term of this patent is extended or adjusted under 35 U.S.C. 154(b) by 376 days.

(21) Appl. No.: 15/362,461

(22) Filed: Nov. 28, 2016

(65) Prior Publication Data

US 2017/0155032 A1 Jun. 1, 2017

(30) Foreign Application Priority Data

Nov. 30, 2015 (JP) ................ 2015-232650

(51) Int. Cl.
| | |
|---|---|
| *H01L 41/04* | (2006.01) |
| *H01L 41/09* | (2006.01) |
| *H01L 41/047* | (2006.01) |
| *B25J 15/00* | (2006.01) |
| *H02N 2/04* | (2006.01) |

(52) U.S. Cl.
CPC .......... *H01L 41/09* (2013.01); *B25J 15/0009* (2013.01); *H01L 41/047* (2013.01); *H01L 41/0986* (2013.01); *H02N 2/046* (2013.01)

(58) Field of Classification Search
CPC . H01L 41/047; H01L 41/193; H01L 41/0986; H02N 2/046

USPC .................................................. 310/328, 800
See application file for complete search history.

(56) References Cited

U.S. PATENT DOCUMENTS

| | | | |
|---|---|---|---|
| 2007/0200468 A1* | 8/2007 | Heim .................. | F04B 43/0054 310/311 |
| 2011/0040408 A1* | 2/2011 | De La Rosa Tames ..................... | B25J 9/1045 700/258 |
| 2015/0342818 A1* | 12/2015 | Ikebe .................. | A61H 1/0288 601/40 |

FOREIGN PATENT DOCUMENTS

JP        2015-37713 A     2/2015

\* cited by examiner

*Primary Examiner* — Derek J Rosenau
(74) *Attorney, Agent, or Firm* — Hamre, Schumann, Mueller & Larson, P.C.

(57) ABSTRACT

A dielectric elastomer driving mechanism includes a driver, a follower, and a power transmitter. The driver includes a dielectric elastomer driving element made up of a dielectric elastomer layer and two electrode layers sandwiching the dielectric elastomer layer. The driver also includes a tension maintaining element maintaining, in a no-voltage state, the dielectric elastomer driving element in a state in which tension occurs, and includes an output portion capable of moving along with the expanding or contracting of the dielectric elastomer driving element. The follower includes a following element actuating in accordance with a driving force inputted. The power transmitter is connected to the output portion of the driver for transmitting a driving force of the driver to the follower.

10 Claims, 9 Drawing Sheets

DIELECTRIC ELASTOMER DRIVING MECHANISM

BACKGROUND OF THE INVENTION

1. Field of the Invention

The present invention relates to a dielectric elastomer driving mechanism.

2. Description of Related Art

In certain applications, dielectric elastomer driving mechanisms are used for actuating following elements ("followers") by the driving force of a driving source. Examples of such driving mechanisms include robot arms of robots utilized in the field of industrial manufacturing, electric artificial arms, and the like. An electric motor is a typical example of the driving source used widely. JP-A-2015-37713 discloses a conventional electric artificial arm in which an electric motor is used as the driving source.

Specifically, the conventional artificial arm disclosed in JP-A-2015-37713 includes a plurality of following elements (having an articulated structure for actuating similarly to the fingers of a human body) and a plurality of electric motors for moving the following elements. In addition, the conventional arm includes a mechanical device such as a link mechanism to convert the rotational driving forces of the electric motors to e.g. reciprocatory movement for actuating the following elements. By controlling the rotation of each individual electric motor, the following elements can be actuated independently so as to simulate the movement of real fingers.

However, the above-mentioned mechanical device for rotation-to-reciprocation conversion is made up of various components, thereby having a complicate structure. Also, if the electric motors are disposed close to the following elements simulating fingers, the weight of a portion corresponding to the human hand will increase. Moreover, in order to ensure a neutral point of a following element, a mechanism is needed that causes two electric motors to rotate simultaneously but in opposite directions, thereby balancing out their driving forces. Such a mechanism, however, tends to generate excessive heat and to result in the decreased efficiency of the device as a whole.

SUMMARY OF THE INVENTION

The present invention has been proposed in the view of the above-described circumstances. It is therefore an object thereof to provide a compact and light dielectric elastomer driving mechanism that has a simple structure but is capable of exerting improved actuation in smoothness and efficiency.

According to an aspect of the present invention, there is provided a dielectric elastomer driving mechanism provided with: a driver that includes a dielectric elastomer driving element having a dielectric elastomer layer and a pair of electrode layers sandwiching the dielectric elastomer layer, a tension maintaining element maintaining, in a potential-free state in which no voltage is applied to the pair of electrode layers, the dielectric elastomer driving element in a state in which tension occurs, and an output portion moving along with expanding or contracting of the dielectric elastomer driving element; a follower that includes a following element actuating in accordance with a driving force inputted; and a power transmitter that is connected to the output portion of the driver and transmits a driving force of the driver to the follower.

Preferably, the driver is provided with a pair of the dielectric elastomer driving elements that are connected in series so as to pull each other in the potential-free state.

Preferably, the pair of dielectric elastomer driving elements each have a conical frustum shape having a small opening and a large opening that are spaced apart from each other in an axial direction.

Preferably, the pair of dielectric elastomer driving elements are disposed such that the axial directions of the respective elements coincide and the small openings of the respective elements face each other. Further, the tension maintaining element relatively fixes positions in the axial directions of the large openings of the pair of dielectric elastomer driving elements, and the output portion is fixed to the small openings of the pair of dielectric elastomer driving elements.

Preferably, the tension maintaining element exhibits an elastic force causing tension to occur in the dielectric elastomer driving element, and the output portion is fixed to one end of the tension maintaining element.

Preferably, the follower includes an auxiliary elastic portion exerting an auxiliary elastic force that causes the following element to actuate in a specific direction.

Preferably, the dielectric elastomer driving element expands more to actuate the following element in the specific direction with increasing of voltage applied to the pair of electrode layers.

Preferably, the power transmitter includes a wire.

Preferably, the driver includes a plurality of output portions and a plurality of groups of dielectric elastomer driving elements that are connected to the plurality of output portions. Further, the driving mechanism is provided with: a plurality of power transmitters that are connected to the plurality of output portions, respectively; and a plurality of followers to which driving force is transmitted via the plurality of power transmitters, respectively.

Preferably, the dielectric elastomer driving elements of the groups each have a conical frustum shape having a small opening and a large opening that are spaced apart from each other in an axial direction, and in each group, a pair of dielectric elastomer driving elements have axial directions that coincide and small openings that face each other. The plurality of output portions are each fixed to the small openings of the pair of dielectric elastomer driving elements.

Preferably, the groups of dielectric elastomer driving elements are disposed in series so that the axial directions of the elements are parallel with each other.

Preferably, the groups of dielectric elastomer driving elements are eccentric to each other as viewed in the axial direction.

According to the present invention, it is pos Bible to prevent a structure from being complicated, to achieve a decrease in the size and weight, and to improve smoothness and efficiency of actuation.

Other features and advantages of the present invention will become more apparent from the detailed description given below with reference to the attached drawings.

DETAILED DESCRIPTION OF PREFERRED EMBODIMENTS

Preferred embodiments of the present invention will be described below with reference to the accompanying drawings.

FIGS. 1 to 7 illustrate a dielectric elastomer driving mechanism according to a first aspect of embodiments of the present invention. A dielectric elastomer driving mechanism A1 of the present aspect includes a driver 1, a follower 2, and a power transmitter 3. In the dielectric elastomer driving mechanism A1, driving force is transmitted from the driver 1 to the follower 2 via the power transmitter 3 in accordance with the voltage applied from a power supply 5, so that required motion of the follower is realized. There is no particular limitation on the applications of the dielectric elastomer driving mechanism A1. As a typical example, the driving mechanism A1 may be applied to a robot arm or an artificial arm.

Figure 1:
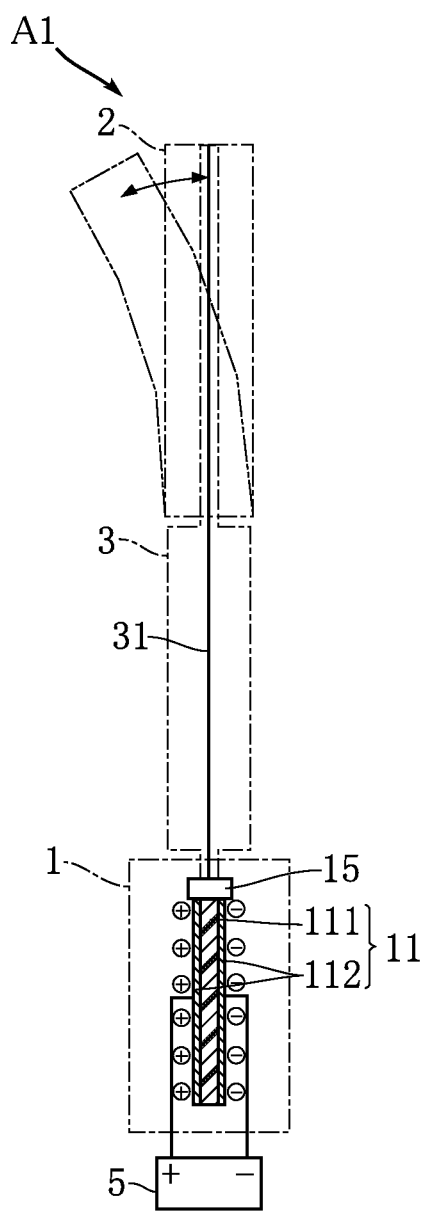
FIG. 1 is a system configuration diagram that schematically shows a dielectric elastomer driving mechanism according to an embodiment of the present invention.
Figure 2:
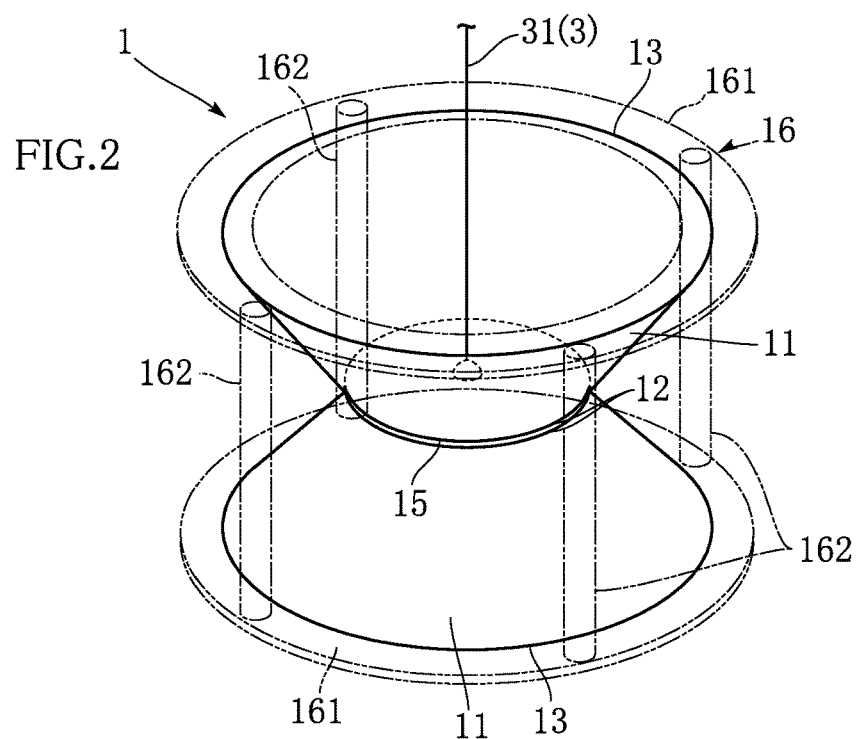
FIG. 2 is a perspective view showing a driver of a dielectric elastomer driving mechanism in FIG. 1.
Figure 3:
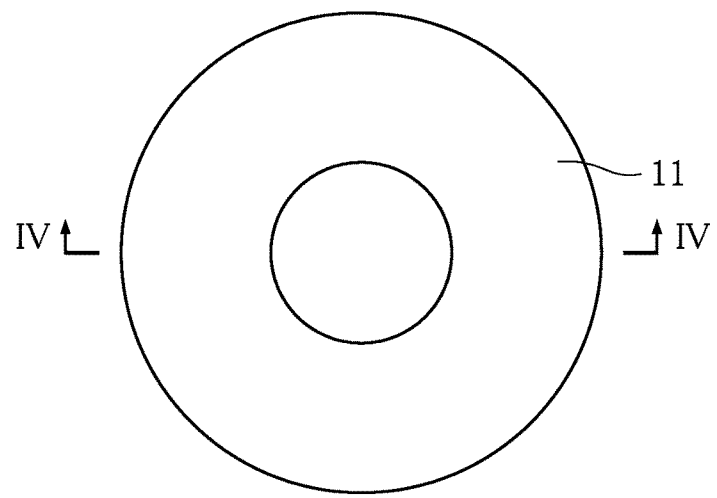
FIG. 3 is a plan view showing a dielectric elastomer driving element in a state before assembling the dielectric elastomer driving mechanism in FIG. 1.
Figure 4:
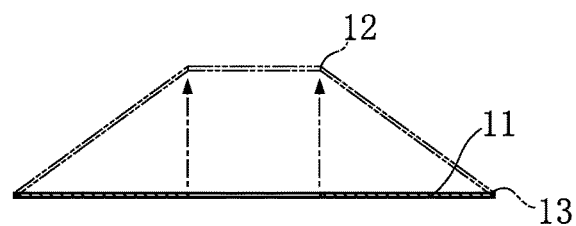
FIG. 4 is a cross-sectional view taken along a line IV-IV in FIG. 3.
Figure 5:
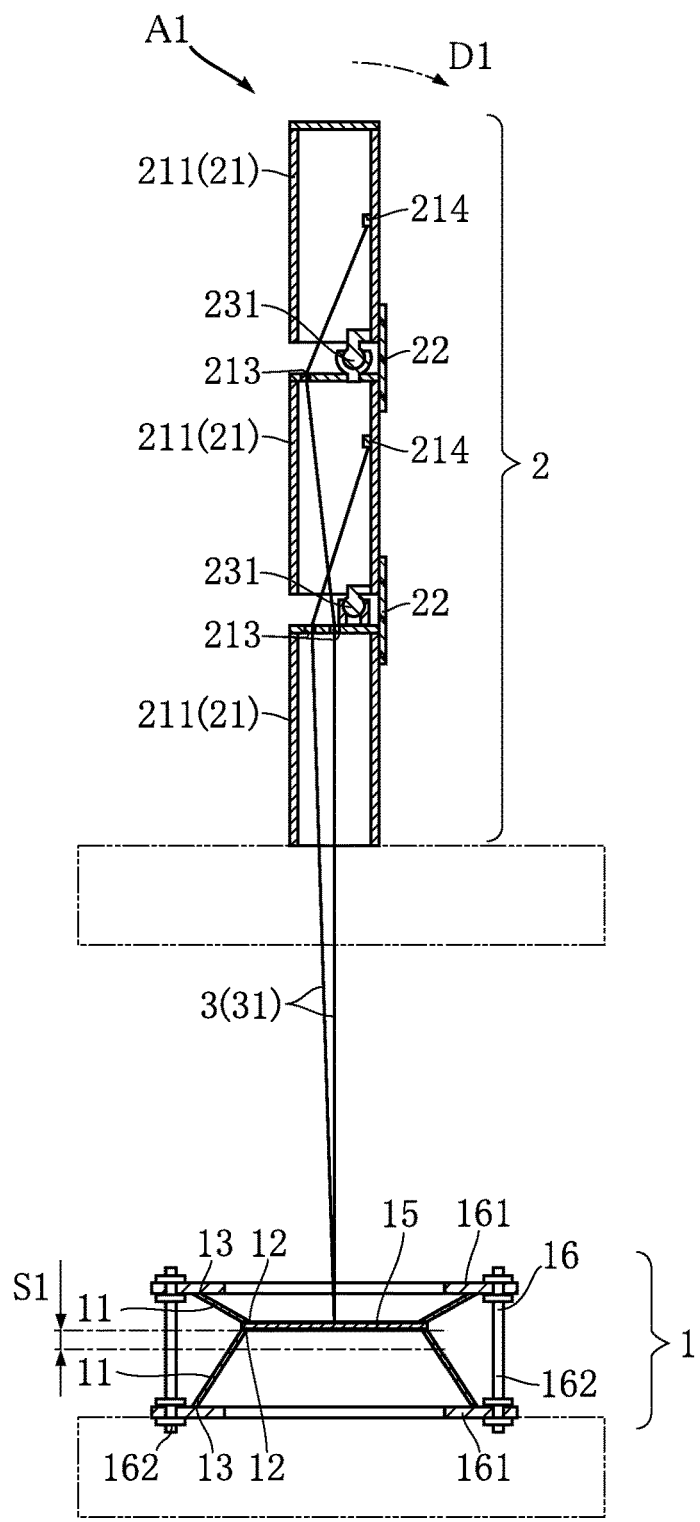
FIG. 5 is a cross-sectional view showing the dielectric elastomer driving mechanism in FIG. 1.
Figure 6:
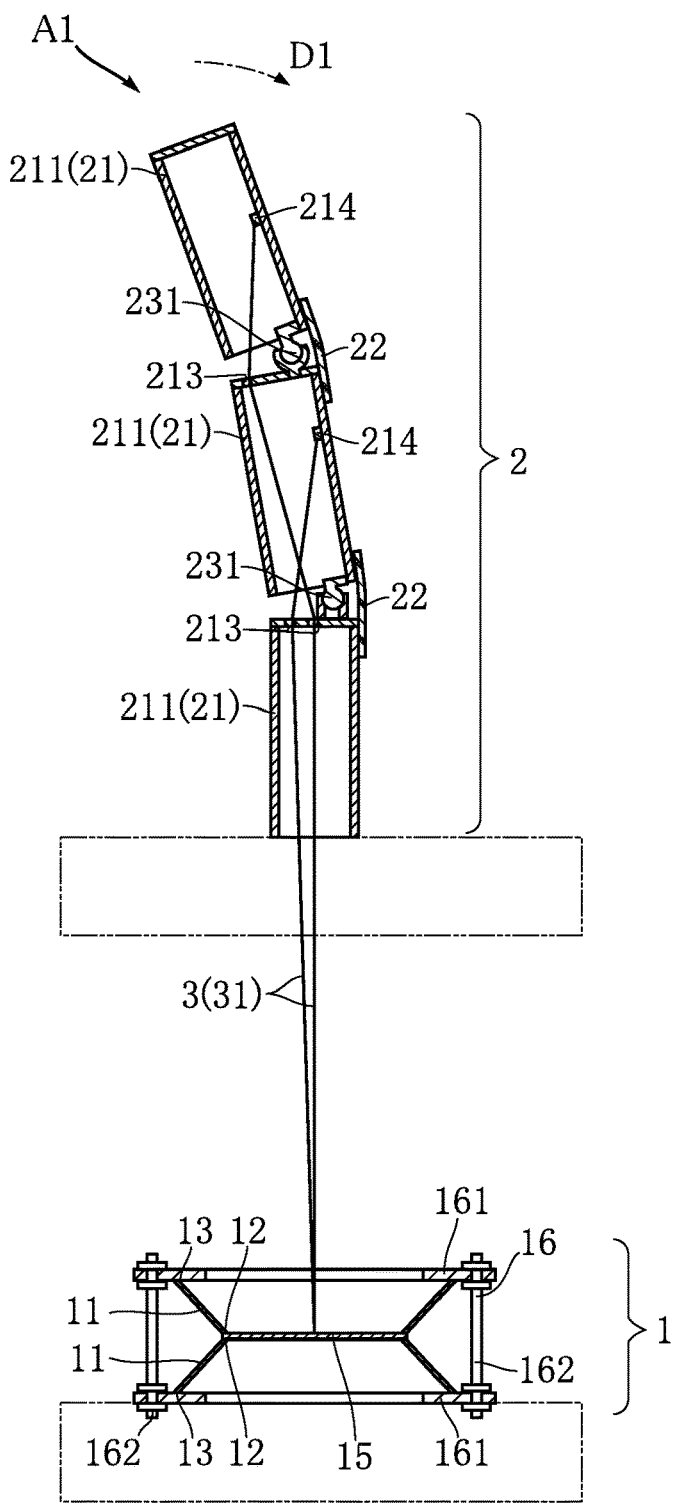
FIG. 6 is a cross-sectional view showing the dielectric elastomer driving mechanism in FIG. 1.
Figure 7:
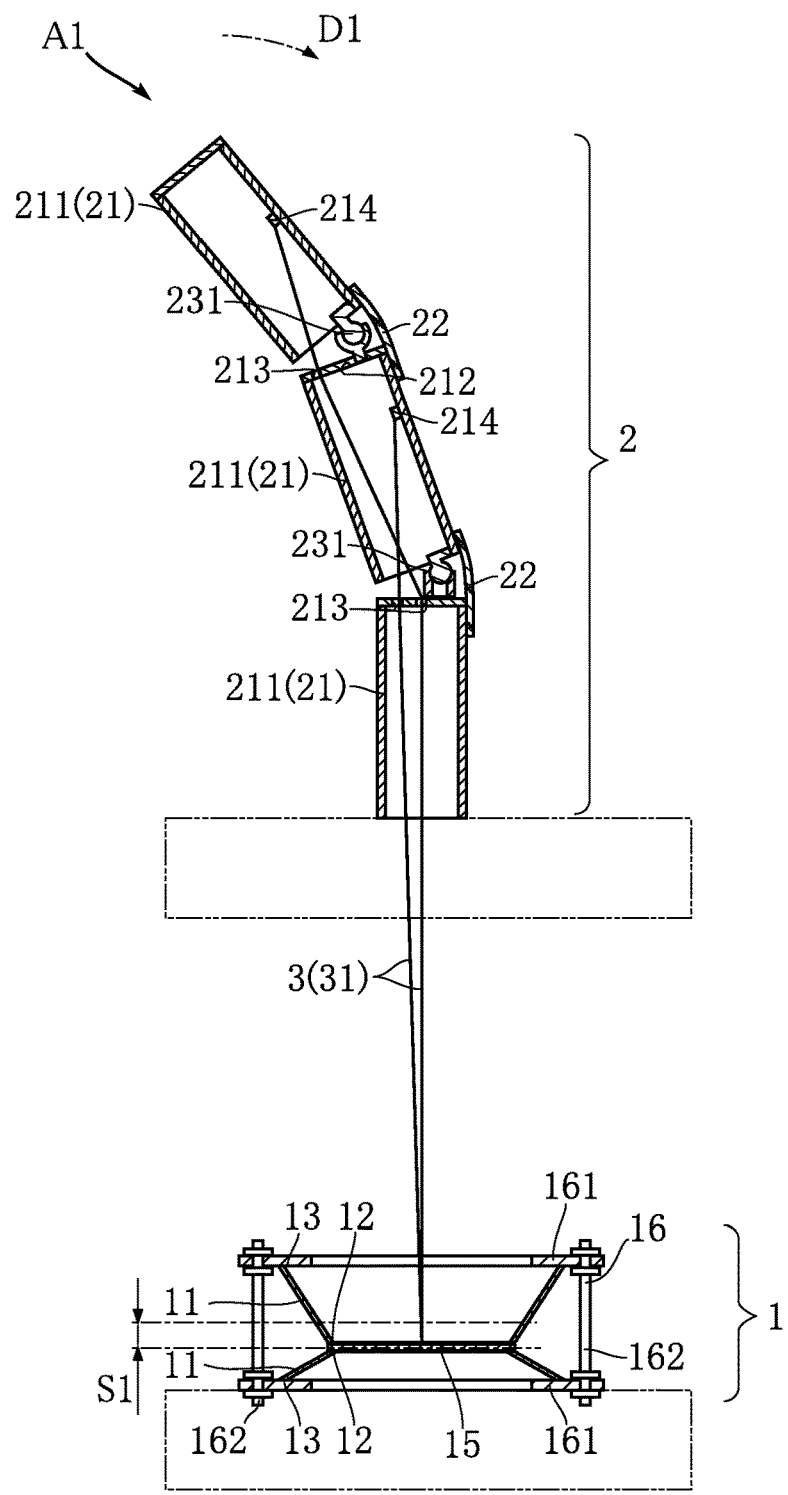
FIG. 7 is a cross-sectional view showing the dielectric elastomer driving mechanism in FIG. 1.

FIG. 1 is a schematic diagram illustrating the notion of the dielectric elastomer driving mechanism A1. FIG. 2 is a perspective diagram showing the driver 1 of the dielectric elastomer driving mechanism A1 in one embodiment. FIG. 3 is a plan view showing a dielectric elastomer driving element 11 in a state before the dielectric elastomer driving mechanism A1 is assembled. FIG. 4 is a cross-sectional view taken along a line IV-IV in FIG. 3. FIGS. 5 to 7 are cross-sectional views showing a plurality of states of actuation of the dielectric elastomer driving mechanism A1.

The driver 1 is a driving power source that generates a driving force that causes required actuation of the dielectric elastomer driving mechanism A1. The driver 1 includes at least one dielectric elastomer driving element 11, an output portion 15, and a tension maintaining element 16 (see FIG. 2). Note that in FIG. 1, the dielectric elastomer driving element 11 is shown merely schematically for facilitating the understanding of the general function of the driving element 11. As described later with reference to FIG. 2, the specific configurations of dielectric elastomer driving elements in a practical example may be different from those shown in FIG. 1.

Referring still to FIG. 1, the dielectric elastomer driving element 11 has a dielectric elastomer layer 111 and a pair of electrode layers 112 separated from each other by the intervening layer 111. The dielectric elastomer driving element 11 can function as the so-called artificial muscle.

In order to use the dielectric elastomer driving element 11 as an artificial muscle, the dielectric elastomer layer 111 needs to be elastically deformable and have a high insulating strength. There is no particular limitation on the material for the dielectric elastomer layer 111. Preferably, a silicone elastomer or acrylic elastomer may be used for the dielectric elastomer layer 111.

The two electrode layers 112 are arranged to sandwich the dielectric elastomer layer 111, and voltage is applied thereto from the power supply 5. The electrode layers 112 are made of an electrically conductive and elastically deformable material so that each layer 112 can expand (and/or shrink) so as to follow the elastic deformation of the dielectric elastomer layer 111. Such a material may be obtained by mixing an electroconductive filler in an elastically deformable main material. Preferably, use may be made of carbon nanotube as the filler.

When there is no voltage application from the power supply 5, the dielectric elastomer driving element 11 is in a natural length state (i.e., the driving element 11 does not expand or contract spontaneously) if it is not receiving external force nor being restricted from outside. In this state, if external force is applied, the dielectric elastomer layer 111 will undergo elastic deformation. When voltage is applied from the power supply 5, positive and negative charges are accumulated in the electrode layers 112, respectively, with the dielectric elastomer layer 111 intervening between the two layers. As a result, the two electrode layers 112 attract each other due to Coulomb force of these charges, and the dielectric elastomer layer 111 is compressed in its thickness direction. Accordingly, the size of the dielectric elastomer layer 111 as viewed in the thickness direction becomes greater. In this manner, the voltage application to the paired electrode layers 112 causes the elastomer layer 111 (hence the dielectric elastomer driving element 11) to expand as viewed in the thickness direction of the elastomer layer 111. Alternatively, it is also possible to arrange that the driving element 11 will shrink as viewed in the thickness direction upon voltage application.

As shown in FIG. 2, the driver 1 of an embodiment includes two dielectric elastomer driving elements 11, the output portion 15, and the tension maintaining element 16.

The dielectric elastomer driving elements 11 each have a conical frustum shape with a small opening 12 and a large opening 13 that are spaced from each other in the axial direction of the cone. Each of the illustrated dielectric elastomer driving elements 11 will expand when voltage is applied to the pair of electrode layers 112 (not shown in FIG. 2) so that their height or length in the axial direction (the vertical distance between the bottom and the top of the frustum) can be adjustably changed.

FIGS. 3 and 4 show one dielectric elastomer driving element 11 in a state before the dielectric elastomer driving mechanism A1 (driver 1) is assembled. As shown in these drawings, the dielectric elastomer driving element 11 before assembly has a flat annular shape. The dielectric elastomer driving element 11 will have the above-described conical frustum shape by being pulled in the vertical direction as illustrated in FIG. 4. Thus, the dielectric elastomer driving element 11, after the dielectric elastomer driving mechanism A1 (driver 1) is assembled, is maintained in a tensioned state (supposing that no voltage is applied to the electrode layers 112).

The two dielectric elastomer driving elements 11 are disposed such that the axial directions of both elements coincide and the small openings 12 of both elements face each other. The power transmitter 3 is connected to the output portion 15. In the present embodiment, the output portion 15 is disposed between and fixed to the small openings 12 of the respective dielectric elastomer driving elements 11.

In the present embodiment, two power supply systems are provided and connected from the power supply 5 so that voltage can be applied to the two dielectric elastomer driving elements 11 independently of each other.

The tension maintaining element 16 is configured to fix the relative position of the large openings 13 of the respective dielectric elastomer driving elements 11 in the axial direction in a manner such that each dielectric elastomer driving element 11 is tensioned in a potential-free state (i.e., when no voltage is applied to the paired electrode layers 112). In the illustrated example, the tension maintaining element 16 includes two rings 161 and a plurality of rods 162. The two rings 161 are fixed to the large openings 13 of the two driving elements 11, respectively. The rods 162 are for fixing the positions of the two rings 161 in the axial direction relative to each other, and each rod 162 is fixed at one end to one of the two rings 161 and fixed at the other end to the other ring 161.

In the present embodiment, the distance between the two large openings 13 of the two dielectric elastomer driving elements 11 fixed by the tension maintaining element 16 is set so as to be larger than the size in the axial direction of the two dielectric elastomer driving elements 11 in the potential-free state in which no voltage is applied. Thus, in the potential-free state, the two dielectric elastomer driving elements 11 are pulling each other in the axial direction, exhibiting elasticity. In other words, the two dielectric elastomer driving elements 11 are connected in series so that the tensions of both elements in the potential-free state work against each other.

The power transmitter 3 is for transmitting the driving force or power of the driver 1 to the follower 2. Also, the power transmitter 3 enables the driver 1 and the follower 2 to be disposed at positions spaced apart from each other. A device having various members and mechanisms that can transmit a driving force can be adopted as the power transmitter 3.

In the present embodiment, the power transmitter 3 may be a wire 31 as an exemplary configuration whereby tension can be transmitted from the driver 1. The wire 31 is made of a metal which deforms markedly less compared to the dielectric elastomer layer 111. One end of the wire 31 is connected to the output portion 15 of the driver 1. In the present embodiment, the driver 1 has only one output portion 15, and the power transmitter 3 is provided by at least one wire 31. In the illustrated example, the power transmitter 3 includes two wires 31 in accordance with the configuration of the follower 2, which will be described later, and one end of each wire is connected to the output portion 15.

The follower 2 actuates in accordance with an input driving force, and has at least one following element 21. The following element 21 is an element with which a specific actuation is realized. Note that the follower 2 need only follow the driving force transmitted from the driver 1 via the power transmitter 3. As a typical example, the follower 2 may have a joint or articulated mechanism, but the invention is not limited thereto. In an embodiment, the follower 2 may include a single following element that is made of an elastic material and can undergo elastic deformation such as expanding, contracting, or bending, for example.

As shown in FIGS. 5 to 7, in the present embodiment, the follower 2 has a joint mechanism, and is made up of a plurality of following elements 21, a plurality of auxiliary elastic portions 22, and a plurality of joint portions 231. The following elements 21 are movable relative to each other, and relative rotation is allowed. The exemplary following elements 21 shown in the drawings are each constituted by a cylindrical body 211 made of a resin or a metal, for example. In the present embodiment, in a state shown in FIG. 5, three cylindrical bodies 211 are disposed in a posture in which the axial directions of the cylindrical bodies coincide.

The joint portions 231 are for rotatably linking the following elements 21 to each other, and realize the joint mechanism. The joint portions 231 are linked such that adjacent supports 23 are linked rotatably.

Among the three cylindrical bodies 211 shown in the drawings, wire holes 213 are formed in the two cylindrical bodies 211 that are located lower down in the drawings. The wire holes 213 are for allowing the wires 31 of the power transmitter 3 to pass through. Also, a wire fixing portion 214 is provided in the cylindrical body 211. The wire fixing portion 214 is a site to which one end of the wire 31 of the power transmitter 3 is fixed, on one side of an inner surface (right side in the drawing) of the cylindrical body 211.

In the illustrated example, the wire 31 connected to the uppermost cylindrical body 211 is inclined with respect to the axial direction of the cylindrical body 211 such that the further the wire 31 is down from the wire fixing portion 214, the further the wire 31 is away from the wire fixing portion 214 in the horizontal direction. This is because the wire hole 213 of the middle cylindrical body 211 is provided on the left side, which is the side spaced apart from the wire fixing portion 214. Similarly, the wire 31 connected to the middle cylindrical body 211 is inclined with respect to the axial direction of the cylindrical body 211 such that the further the wire 31 is down from the wire fixing portion 214, the further the wire 31 is away from the wire fixing portion 214 in the horizontal direction, since the wire hole 213 of the lowermost cylindrical body 211 is provided on the left side, which is the side spaced apart from the wire fixing portion 214.

The auxiliary elastic portion 22 is for causing the following element 21 to actuate in a direction D1. In the present embodiment, two auxiliary elastic portions 22 are fixed to cylindrical bodies 211 (the following elements 21) that are adjacent to each other. Although there is no limitation on the material of the auxiliary elastic portion 22, rubber is an example as a material that reliably exhibits elasticity. If the following elements 21 are not connected to the driver 1 by the power transmitter 3, the following elements 21 bend in the specific direction D1 from a state shown in FIG. 5 due to the elasticity of the auxiliary elastic portion 22.

Next, the workings of the dielectric elastomer driving mechanism A1 will be described with reference to FIGS. 5 to 7.

FIG. 5 shows a state in which the following elements 21 are in an upright state. In this state, voltage is applied to only the lower dielectric elastomer driving element 11 in FIG. 5 of the two dielectric elastomer driving elements 11 of the driver 1, and the dielectric elastomer driving element 11 expands in the axial direction (the vertical direction in FIG. 5) by a length S1 with respect to the potential-free state.

Accordingly, the upper dielectric elastomer driving element 11 in FIG. 5 contracts. Also, the output portion 15 moves upward in FIG. 5 by the length S1 compared to the state in which no voltage is applied. Accordingly, in the follower 2, the following elements 21 are allowed to move in the direction D1 due to the auxiliary elastic portions 22, and as a result, the following elements 21 are upright.

FIG. 6 shows a potential-free state in which voltage is not applied to either of the two dielectric elastomer driving elements 11. Thus, the two dielectric elastomer driving elements 11 do not exhibit active expanding behavior. Thus, the output portion 15 is located lower down in FIG. 6, by the length S1 compared to FIG. 5. The tension that is transmitted to the follower 2 via the wire 31 of the power transmitter 3 increases in accordance with movement of this output portion 15. Accordingly, the two upper cylindrical bodies 211 in FIG. 6 rotate about the joint portion 231 of the support 23 as a fulcrum. As a result, the follower 2 adopts a posture of bending slightly on the opposite side to the direction D1.

Note that the state shown in FIG. 6 is a potential-free state in which voltage is not applied to the two dielectric elastomer driving elements 11. In the potential-free state, the tensions of the two dielectric elastomer driving elements 11 are maintained by the tension maintaining element 16. The two dielectric elastomer driving elements 11 maintained by the tension maintaining element 16 counterbalance each other. Thus, the posture of the follower 2 shown in FIG. 6 is realized by only the balance between the elastic force of the two dielectric elastomer driving elements 11 of the driver 1 and the two auxiliary elastic portions 22 of the follower 2, and electric energy is not provided at all. This state is referred to as the neutral state of the dielectric elastomer driving mechanism A1.

In FIG. 7, voltage is applied to only the upper dielectric elastomer driving element 11 in FIG. 7, and this dielectric elastomer driving element 11 expands by the length S1 in the axial direction (the vertical direction in FIG. 7) with respect to the state shown in FIG. 6. Accordingly, the output portion 15 moves downward in FIG. 7 by the length S1 in the axial direction with respect to the neutral state shown in FIG. 6. Accordingly, the tension transmitted to the follower 2 via the wire 31 of the power transmitter 3 increases, and thus the two upper cylindrical bodies 211 in FIG. 7 rotate about the joint portion 231 of the support 23 as the fulcrum, and the follower 2 adopts a posture of bending toward the opposite side to the direction D1.

It is now assumed that the states shown in FIGS. 5 and 7 are states in which the maximum voltage is applied to only one of the dielectric elastomer driving elements 11. Then, the dielectric elastomer driving mechanism A1 can selectively take any intermediate state between the two extreme states (FIGS. 5 and 7) by controlling the voltage application to the upper or lower driving element 11. Thus, by such control, the dielectric elastomer driving mechanism A1 can realize actuation or movement expected for a robot arm, an artificial arm, or the like.

Next, advantages of the dielectric elastomer driving mechanism A1 will be described.

According to the embodiments described above, the driver 1 exhibits a driving force due to the dielectric elastomer driving elements 11. The dielectric elastomer driving elements 11 can freely control the size and speed of deformation by controlling the applied voltage. Also, the driver 1 exhibits a driving force in a direction (axial direction) in which the wires 31 of the power transmitter 3 reciprocate. Thus, it is not necessary to provide a mechanism that converts rotational driving force to reciprocatory movement, as is required in a configuration in which an electric motor is used. Also, the dielectric elastomer driving elements 11 are made lightweight compared to an electric motor. Therefore, a decrease in the size and weight of the dielectric elastomer driving mechanism A1 can be achieved.

The driver 1 is maintained in a state in which tensions occur in the two dielectric elastomer driving elements 11 due to the tension maintaining element 16 in a potential-free state. Thus, if voltage is applied to either one of the two dielectric elastomer driving elements 11, the output portion 15 moves more quickly due to the tension that has been maintained in advance, in addition to the expanding of the dielectric elastomer driving element 11 to which the voltage is applied. This enables the follower 2 to be actuated more smoothly.

Providing the power transmitter 3 makes it possible to set the driver 1 and the follower 2 at positions spaced apart from each other. Accordingly, the size of the follower 2 does not depend on the size of the driver 1. Thus, the dielectric elastomer driving mechanism A1 is preferable in the case where actuation resulting from smaller follower 2 being disposed at positions that are spaced further from each other is required, such as usage in the medical field, for example. The power transmitter 3 constituted by the wires 31 can easily increase its transmission distance.

As described with reference to FIG. 6, in the dielectric elastomer driving mechanism A1, the above-described neutral state in which the follower 2 is located at a neutral position in the movable range can be held without applying any voltage to the driver 1. Thus, if the neutral state is selected as the potential-free state of the dielectric elastomer driving mechanism A1, energy consumption does not occur as long as this neutral state is continued. Therefore, the dielectric elastomer driving mechanism A1 enables energy-saving operation.

FIGS. 8 to 12 show variations and other embodiments of the invention. Note that in these drawings, the same reference numerals as the above-described embodiment are given to elements that are same as or similar to those of the above-described embodiment.

Figure 8:
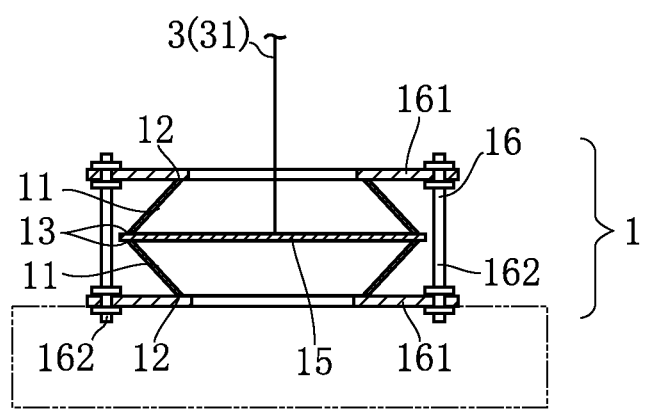
FIG. 8 is a cross-sectional view showing a variation of a driver of the dielectric elastomer driving mechanism in FIG. 1.

FIG. 8 shows a variation of the driver 1. In this variation, the two dielectric elastomer driving elements 11 are disposed such that the axial directions of both elements coincide and the large openings 13 of both elements face each other. The output portion 15 is then disposed between the large openings 13 of the two dielectric elastomer driving elements 11, and is fixed with respect to these large openings 13. Also, in this variation, the relative positions in the axial direction of the small openings 12 of the two dielectric elastomer elements 11 are fixed by the tension maintaining element 16. Such a variation also enables the dielectric elastomer driving mechanism A1 to be actuated more smoothly.

Figure 9:
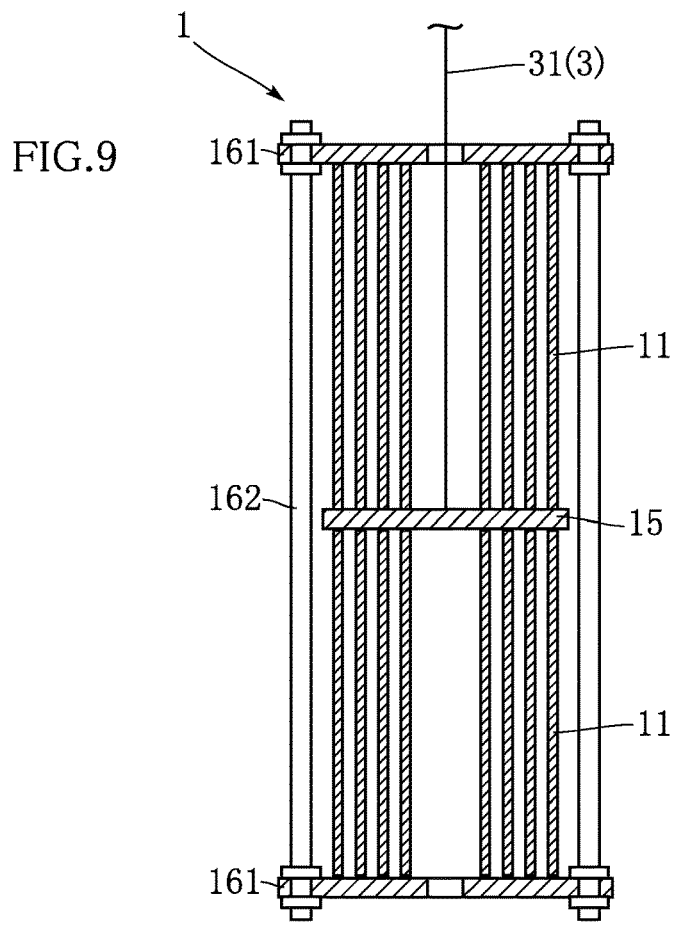
FIG. 9 is a cross-sectional view showing another variation of a driver of the dielectric elastomer driving mechanism in FIG. 1.

FIG. 9 shows another variation of the driver 1. In this variation, each of the two dielectric elastomer driving elements 11 is wound about a vertical axis in FIG. 9. The lower end of the upper dielectric elastomer driving element 11 and the upper end of the lower dielectric elastomer driving element 11 are fixed to the output portion 15. Also, the upper end of the upper dielectric elastomer driving element 11 and the lower end of the lower dielectric elastomer driving element 11 are fixed to the tension maintaining element 16. In this variation as well, in the potential-free state, the two dielectric elastomer driving elements 11 are so restricted by the tension maintaining element 16 as to pull each other in the vertical direction. Thus, the two dielectric elastomer driving elements 11 are maintained in a state in which tensions occur in the potential-free state. Such a variation also enables the dielectric elastomer driving mechanism A1 to be actuated smoothly.

Figure 10:
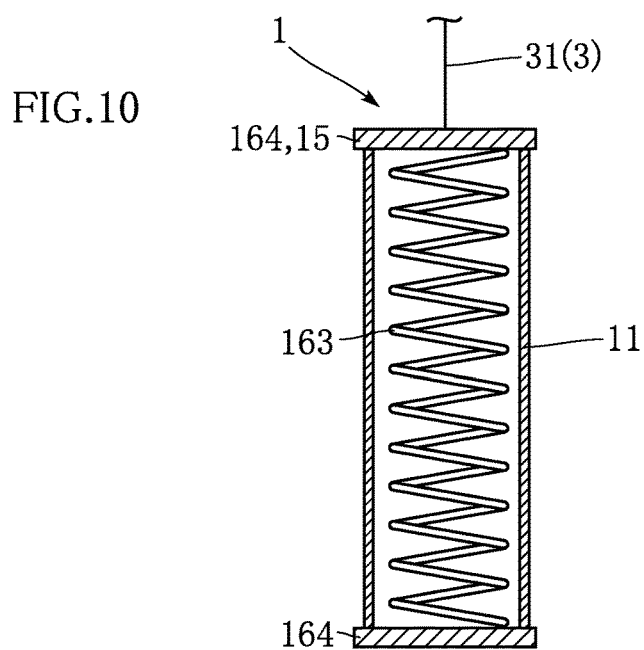
FIG. 10 is a cross-sectional view showing another variation of the driver of the dielectric elastomer driving mechanism in FIG. 1.

FIG. 10 shows another variation of the driver 1. In this variation, the driver 1 has one dielectric elastomer driving element 11, an output portion 15, and tension maintaining element. The dielectric elastomer driving element 11 has a cylindrical shape, for example. The tension maintaining element is made up of a spring 163 and two plates 164. The spring 163 is a coiled spring, for example, and exerts elastic force for giving tension to the dielectric elastomer driving element 11. The plates 164 are fixed to both ends of the spring 163. Note that in this variation, a wire 31 is connected to the upper plate 164 in FIG. 10. Thus, the upper plates 164 serves as the output portion 15.

The two ends of the dielectric elastomer driving element 11 are fixed to the two plates 164 so as to surround the spring 163. In the illustrated example, the natural length of the dielectric elastomer driving element 11 is shorter than the natural length of the spring 163. Thus, in a state in which the driver 1 is assembled, the dielectric elastomer driving element 11 tends to expand due to the compressed spring 163, and the tension in the driving element 11 and the restoring force of the spring 163 are counterbalanced.

In this variation, if voltage is applied to the dielectric elastomer driving element 11, the dielectric elastomer driving element 11 expands and the distance between the two plates 164 is maximized. Thus, if the lower plate 164 in FIG. 10 is fixed to an external object, the output portion 15 can be freely moved by the applied voltage. Such a variation also enables the dielectric elastomer driving mechanism A1 to be actuated smoothly.

Figure 11:
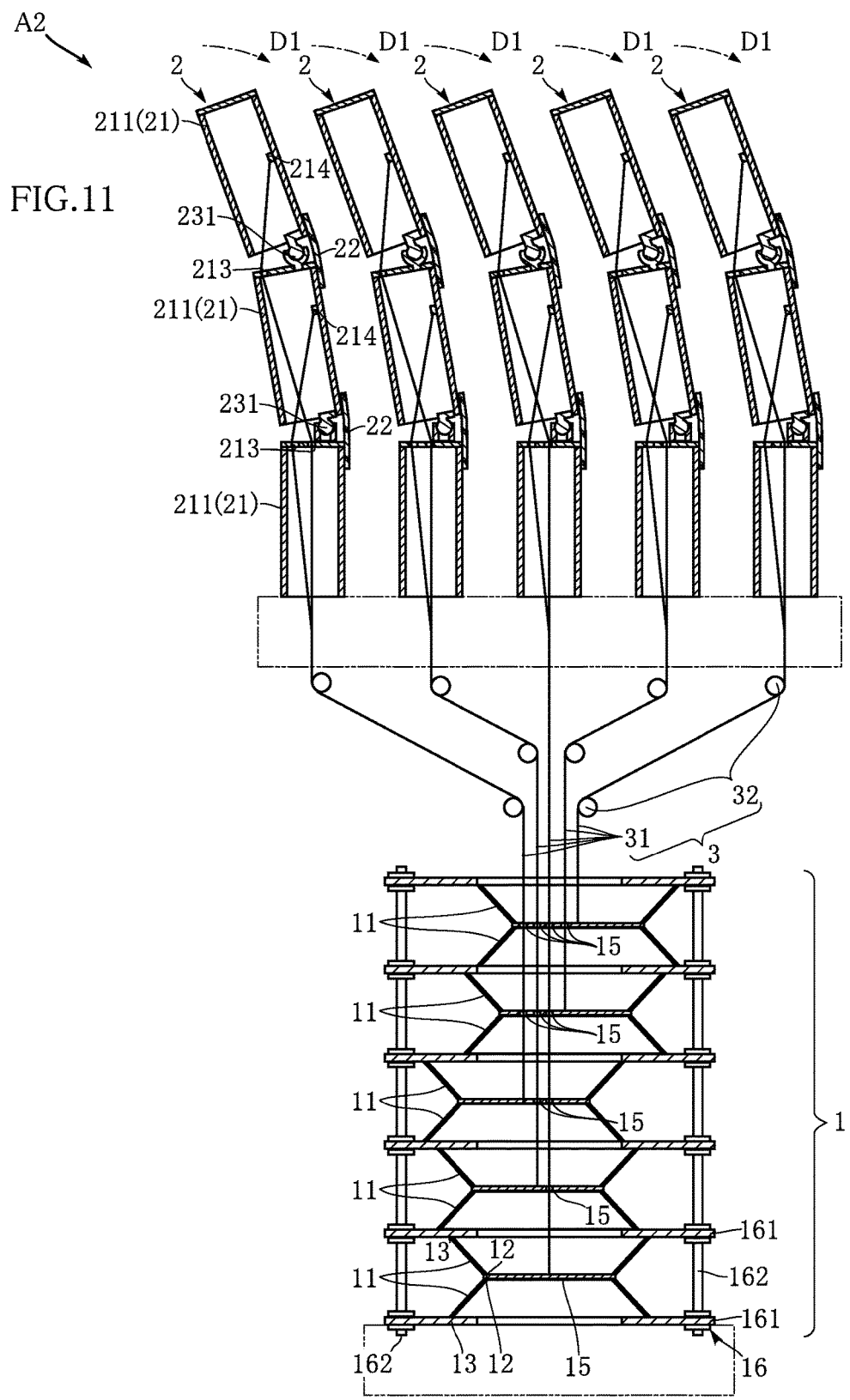
FIG. 11 is a schematic cross-sectional view showing a dielectric elastomer driving mechanism according to another embodiment of the present invention.

FIG. 11 shows a dielectric elastomer driving mechanism according to another embodiment of the present invention. A dielectric elastomer driving mechanism A2 of this embodiment includes a driver 1, a plurality of followers 2, and a plurality of power transmitters 3, and the followers 2 are actuated by the driver 1.

There is no limitation on the specific configuration of the followers 2 as long as each follower 2 follows the driving force of the driver 1. In the example shown in FIG. 11, each follower 2 having a configuration similar to that of the follower 2 of the dielectric elastomer driving mechanism A1 is adopted. Also, there is no particular limitation on relative arrangement of the followers 2. In the example shown in FIG. 11, the followers 2 have an arrangement similar to that of human fingers.

The driver 1 includes a plurality of groups of dielectric elastomer driving elements, where each group is made up of two dielectric elastomer driving elements 11. In the example shown in FIG. 11, the two dielectric elastomer driving elements 11 in each group have a conical frustum shape similar to that of the above-described dielectric elastomer driving mechanism A1, though the invention is not limited to this particular configuration.

As shown in the figure, the tension maintaining element 16 restricts the groups of dielectric elastomer driving elements 11, and maintains a state in which tensions occur in the groups of the dielectric elastomer driving elements 11 in the potential-free state. In the illustrated example, the tension maintaining element 16 has a plurality of rings 161 and a plurality of rods 162. The rings 161 are fixed by the rods 162 in a state in which the rings 161 are spaced apart from each other in the vertical direction in FIG. 11. The distance between adjacent rings 161 is set to a distance that causes tension to occur in the grouped two dielectric elastomer driving elements 11 in the potential-free state. With such a configuration, the groups of dielectric elastomer driving elements 11 can independently conduct driving movement caused by applying voltage in the potential-free state.

Figure 12:
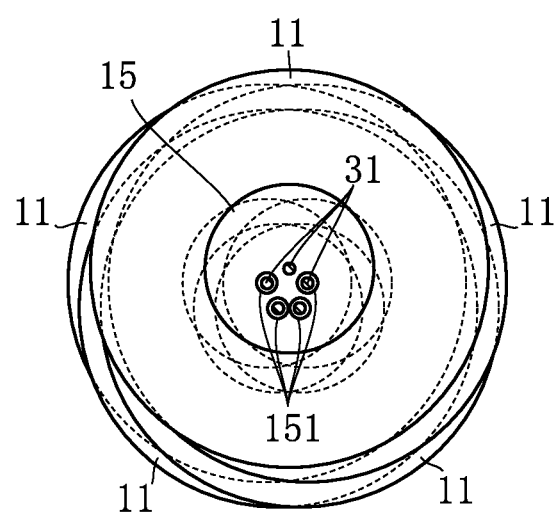
FIG. 12 is a plane view showing a driver of the dielectric elastomer driving mechanism in FIG. 11.

The groups of dielectric elastomer driving elements 11 are disposed vertically in series so that their axial directions are parallel with each other. FIG. 12 is a plan view showing the groups of dielectric elastomer driving elements 11, and shows a view in the axial direction of the groups of dielectric elastomer driving elements 11. In the present embodiment, the groups of dielectric elastomer driving elements 11 are disposed eccentrically to each other as viewed in the axial directional.

The power transmitter 3 has a plurality of wires 31. The wires 31 are each connected to a different one of the output portions 15 fixed to the groups of dielectric elastomer driving elements 11. The wires 31 are connected to the centers as viewed in the axial direction of the output portions 15. The wires 31 are also disposed eccentrically to each other due to the groups of dielectric elastomer driving elements 11 being disposed eccentrically. Note that in FIG. 11, for convenience of illustration, the wires 31 are schematically shown as disposed side by side in the horizontal direction in FIG. 11. The wires 31 can be disposed to form the apexes of a polygon shown in FIG. 12, for example. Wire holes 151 of a required number are formed in the output portions 15. The wire holes 151 are for allowing the wires 31 connected to the output portions 15 located lower down in FIG. 11 than the output portion 15 in which the wire holes 151 are formed to pass through.

The power transmitter 3 further includes a plurality of pulleys 32. The pulleys 32 are for guiding the wires 31 extending from the driver 1 toward the followers 2 to which the wires 31 are to transmit driving force.

According to the present embodiment as well, it is possible to achieve a decrease in the size and weight of the dielectric elastomer driving mechanism A2, and enable the followers 2 to be actuated more smoothly. Also, disposing the groups of dielectric elastomer driving elements 11 in series makes it possible to avoid the driver 1 becoming unduly wide. Disposing the groups of dielectric elastomer driving elements 11 eccentrically to each other makes it possible to connect the wires 31 to the center of the output portion 15 and to prevent the wires 31 from interfering with each other. Connecting the wires 31 to the center of the output portion 15 is suitable for causing each of the groups of dielectric elastomer driving elements 11 to smoothly actuate, and for efficiently transmitting driving forces via the wires 31.

The dielectric elastomer driving mechanism according to the present invention is not limited to the above-described embodiments. A specific configuration of the portions of the dielectric elastomer driving mechanism according to the present invention can be freely designed or modified in various ways.

For example, if a large operating power is required depending on the application of the dielectric elastomer driving mechanism, the driver or the power transmitter may be provided with a mechanism for amplifying the driving force of the dielectric elastomer driving elements of the driver. Examples of such an amplification mechanism include various mechanisms in which the principle of leverage is used, such as a pulley, for example. A configuration in which the tension is maintained in the dielectric elastomer driving element 11 in the potential-free state enables the driver 1 to exhibit not only tension (a pulling force) but also pressure (a pressing force). Thus, a configuration including a member that may transmit not only tension (the pulling force) but also pressure (the pressing force) may be adopted as the power transmitter 3. In this case, the follower 2 can be actuated even though the above-described auxiliary elastic portion 22 is not provided.

The invention claimed is:

1. A dielectric elastomer driving mechanism comprising:
a driver that includes a dielectric elastomer driving element having a dielectric elastomer layer and a pair of electrode layers sandwiching the dielectric elastomer layer, a tension maintaining element maintaining, in a potential-free state in which no voltage is applied to the pair of electrode layers, the dielectric elastomer driving element in a state in which tension occurs, and an output portion moving along with expanding or contracting of the dielectric elastomer driving element;
a follower that includes a following element actuating in accordance with a driving force inputted; and
a power transmitter that is connected to the output portion of the driver and transmits a driving force of the driver to the follower,
wherein the power transmitter includes a wire that causes the follower to actuate in a first specific direction, and
the follower includes an auxiliary elastic portion exerting an auxiliary elastic force that causes the following element to actuate in a second specific direction that is different from the first specific direction.

2. The dielectric elastomer driving mechanism according to claim 1, wherein the driver comprises a pair of the dielectric elastomer driving elements, and the pair of dielectric elastomer driving elements are connected in series so as to pull each other in the potential-free state.

3. The dielectric elastomer driving mechanism according to claim 2, wherein the pair of dielectric elastomer driving elements each have a conical frustum shape having a small opening and a large opening that are spaced apart from each other in an axial direction.

4. The dielectric elastomer driving mechanism according to claim 3, wherein the pair of dielectric elastomer driving elements are disposed such that the axial directions of the respective elements coincide and the small openings of the respective elements face each other,
the tension maintaining element relatively fixes positions in the axial directions of the large openings of the pair of dielectric elastomer driving elements, and
the output portion is fixed to the small openings of the pair of dielectric elastomer driving elements.

5. The dielectric elastomer driving mechanism according to claim 1, wherein the tension maintaining element exhibits an elastic force causing tension to occur in the dielectric elastomer driving element, and the output portion is fixed to one end of the tension maintaining element.

6. The dielectric elastomer driving mechanism according to claim 1, wherein the dielectric elastomer driving element expands more to actuate the following element in the second specific direction with increasing of voltage applied to the pair of electrode layers.

7. The dielectric elastomer driving mechanism according to claim 1, wherein the driver includes a plurality of output portions and a plurality of groups of dielectric elastomer driving elements that are connected to the plurality of output portions, and
the driving mechanism comprises:
a plurality of power transmitters that are connected to the plurality of output portions, respectively; and
a plurality of followers to which driving force is transmitted via the plurality of power transmitters, respectively.

8. The dielectric elastomer driving mechanism according to claim 7, wherein the dielectric elastomer driving elements of the groups each have a conical frustum shape having a small opening and a large opening that are spaced apart from each other in an axial direction, and in each group, a pair of dielectric elastomer driving elements have axial directions that coincide and small openings that face each other, and
the plurality of output portions are each fixed to the small openings of the pair of dielectric elastomer driving elements.

9. The dielectric elastomer driving mechanism according to claim 8, wherein the groups of dielectric elastomer driving elements are disposed in series so that the axial directions of the elements are parallel with each other.

10. The dielectric elastomer driving mechanism according to claim 9, wherein the groups of dielectric elastomer driving elements are eccentric to each other as viewed in the axial direction.

* * * * *